United States Patent [19]
Osorio

[11] Patent Number: 5,317,107
[45] Date of Patent: May 31, 1994

[54] SHIELDED STRIPLINE CONFIGURATION SEMICONDUCTOR DEVICE AND METHOD FOR MAKING THE SAME

[75] Inventor: Rolando J. Osorio, Manchaca, Tex.
[73] Assignee: Motorola, Inc., Schaumburg, Ill.
[21] Appl. No.: 949,958
[22] Filed: Sep. 24, 1992
[51] Int. Cl.$^5$ .................. H01L 23/02; H05K 9/00
[52] U.S. Cl. .................. 174/52.4; 174/35 R; 257/659; 361/818
[58] Field of Search ............ 174/35 R, 51, 52.4; 257/659, 660; 361/402, 816, 818

[56] References Cited

U.S. PATENT DOCUMENTS

| | | | |
|---|---|---|---|
| 4,229,758 | 10/1980 | Ikari | 257/659 X |
| 4,614,836 | 9/1986 | Carpenter et al. | 174/51 |
| 4,714,952 | 12/1987 | Takekawa et al. | 361/402 X |
| 4,831,212 | 5/1989 | Ogata et al. | 174/52.4 |
| 4,888,449 | 12/1989 | Crane et al. | 174/52.4 |
| 4,939,316 | 7/1990 | Mahulikar et al. | 174/52.4 |
| 5,023,398 | 6/1991 | Mahulikar et al. | 174/52.4 |
| 5,043,534 | 8/1991 | Mahulikar et al. | 174/52.4 |
| 5,068,708 | 11/1991 | Newman | 257/659 X |
| 5,073,521 | 12/1991 | Braden | 437/209 |
| 5,159,750 | 11/1992 | Dutta et al. | 174/52.4 X |

FOREIGN PATENT DOCUMENTS 55-128847 10/1980 Japan .................. 257/660

Primary Examiner—Leo P. Picard
Assistant Examiner—Bot Ledinh
Attorney, Agent, or Firm—Minh-Hien N. Clark

[57] ABSTRACT

Electrical parasitic parameters can lead to reflections and switching noise in a circuit causing signal distortions. A stripline configuration semiconductor device (10) can be manufactured to reduce the overall parasitic parameters, especially inductance, of a device. In one embodiment, a semiconductor die (12) having a grounded backside (20) is directly bonded with an electrically conductive adhesive (22) to a metal base (16), thus grounding the metal base. The die is also electrically connected to a leadframe (14) by wire bonds (24). An electrically insulating adhesive (28) is used to seal a metal lid (18) to the metal base with the die and leadframe disposed between the lid and base, thus forming a protective package body. The lid is grounded to a ground lead (26) of the leadframe with a solder bridge (30). An additional advantage to having a metal package body is that it provides shielding for the device.

22 Claims, 2 Drawing Sheets

SHIELDED STRIPLINE CONFIGURATION SEMICONDUCTOR DEVICE AND METHOD FOR MAKING THE SAME

FIELD OF THE INVENTION

The present invention relates to semiconductor devices in general, and more specifically to semiconductor devices having metal package bodies that are grounded to the same reference plane.

BACKGROUND OF THE INVENTION

In any semiconductor device, the electrical parameters of capacitance and inductance are always present and cause signal delays in addition to signal distortions. These electrical parameters are considered parasitic parameters. All signal lines have a certain capacitance; they store an electric charge when a voltage is applied. To change the voltage, the amount of charge must be changed by the flow of electric current. This flow causes the buildup of a magnetic field that induces voltage into the current-carrying line (self-inductance), resisting the current flow, and into the other lines in the proximity of line being switched (mutual-inductance) causing a current flow there. The time during which the signal transits from its old value to the new value is limited by the current flow. Thus, the transition time increases with increasing capacitance. Shorter transition times improve performance.

The design of faster devices is concerned with the reduction of the device input capacitance and with the reduction of the driving impedance. The packaging of these devices can control the signal line capacitance to the reference plane, line self-inductance, and interline capacitances and inductances. Consequently, it can control the signal distortions and the appearance of unwanted interferences.

One internal cause of degradation as the signal propagates through the package are reflections. Signal reflections can increase transition time in a circuit. Reflections may also split the signal into two or more pulses with the potential of causing erroneous switching in subsequent circuits. Therefore, it is desirable to control signal reflections.

As semiconductor device technology advances wherein devices are operating at higher speeds and the number of inputs/outputs (I/Os) simultaneously switching increases, the need to control inductance in a semiconductor device becomes more critical to control simultaneous switching noise. Switching noise is an induced voltage on the power distribution system at the circuit terminals caused by the rapidly changing current caused by the simultaneous switching of many drivers.

Switching noise is directly proportional to slew rate and is caused by the inherent inductance of the power and ground lines. The higher the inductance, the higher the change in current. It is desirable to have low power and ground inductances to reduce the slew rate magnitude, thus reducing simultaneous switching noise.

Simultaneous switching noise is a problem in any package that has a large power and/or ground inductance. In packaging design considerations, switching signal I/Os should be sandwiched between two planes, for example, two ground planes or a power and ground plane, thus providing low inductance paths for switching currents during both low to high and high to low logic transitions. The effective inductance of a switching circuit is a function of self and mutual inductance. Inductance of package interconnects affects both noise and speed characteristics of a packaged semiconductor device.

A stripline sandwiches a conductor between two planes, either power or ground. The conductor is further separated from the two planes by a dielectric, so that the resulting structure is that of a conductor sandwiched by a dielectric further sandwiched by two planes. In a stripline configuration, the inductance of the conductor can be reduced to approximately 30% of its original inductance.

SUMMARY OF THE INVENTION

In accordance with the invention, there is provided a shielded stripline configuration semiconductor device having a semiconductor die, a leadframe, a metal base, a metal lid, and an electrically insulating adhesive. The semiconductor die has a power supply terminal. The leadframe is electrically connected to the semiconductor die. The metal base is electrically connected to the power supply terminal of the semiconductor die. The metal lid is also electrically connected to the power supply terminal of the semiconductor die. The electrically insulating adhesive seals the metal base and lid together, wherein the semiconductor die and the leadframe are disposed in between the metal base and lid such that the metal base and lid form a protective package body around the semiconductor die and a portion of the leadframe.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 1:
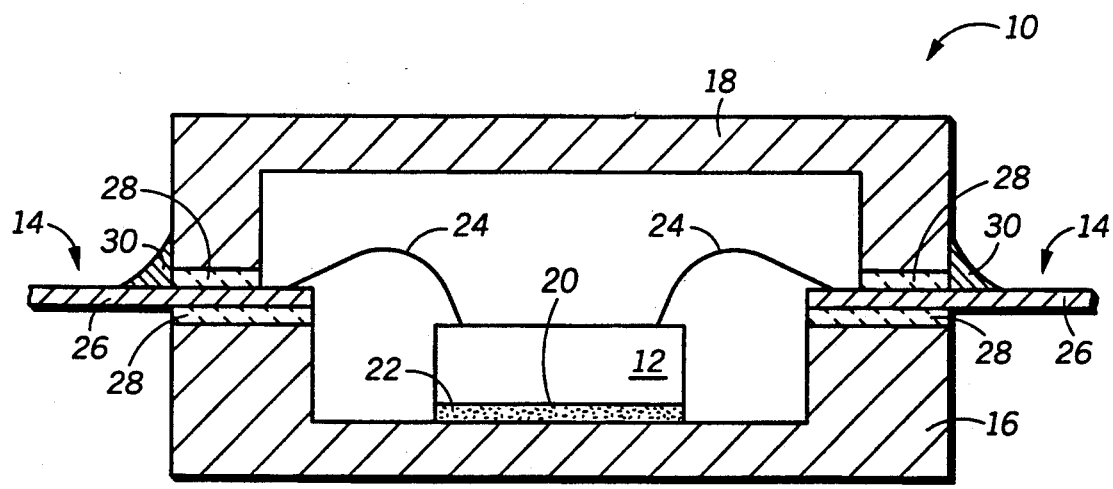
FIG. 1 illustrates, in cross-section, a shielded stripline configuration semiconductor device, a first embodiment of the present invention.

Embodiments of the invention will now be discussed in detail with reference to the figures. As mentioned previously, it is desirable to reduce the inductance of a semiconductor device to limit the amount of switching noise that occurs in circuits, especially high speed ones. The advantages of a stripline configuration will be used in the packaging of a semiconductor device to reduce its overall parasitic parameters.

Illustrated in FIG. 1 is a cross-sectional view of a shielded stripline configuration semiconductor device 10, a first embodiment of the present invention. Device 10 has a semiconductor die 12, a leadframe 14, a metal base 16, and a metal lid 18. Semiconductor die 12 has a power supply terminal (not shown) as part of its circuitry. In a preferred embodiment, the power supply terminal is a ground terminal. The backside 20 of the semiconductor die 12 is electrically connected to the power supply terminal (not shown). Semiconductor die 12 is directly bonded to the metal base 16 with an electrically conductive adhesive 22. Electrically conductive adhesive 22 can be, but not limited to, a silver-filled die attach epoxy or the like. This method of attachment serves to electrically connect the metal base 16 to the power supply terminal (not shown). Furthermore, if the power supply terminal is a ground terminal, then the metal base 16 is therefore grounded.

Additionally illustrated in FIG. 1 is the leadframe 14 being electrically connected to the semiconductor die 12 by a plurality of wire bonds 24. Leadframe 14 has a plurality of leads 26, including signal, power, and ground leads. For the purpose of discussing embodiments of the invention, all leads 26 illustrated will be considered ground leads, although it is implicitly understood that other leads not shown in this cross section constitute the remaining signal, power, and ground leads.

FIG. 1 further illustrates the metal lid 18 and metal base 16 being sealed together with an adhesive 28, wherein the semiconductor die 12 and a portion of the leadframe 14 is disposed between the lid 18 and base 16. Adhesive 28 is an electrical insulator, and can be a B-staged adhesive or a sealing glass or another suitable adhesive. The metal base 16 and lid 18 are made from a non-ferromagnetic metal, for example anodized aluminum or copper.

Also illustrated in FIG. 1 are solder bridges 30 connecting the metal lid 18 to the ground leads 26. This effectively electrically connects the metal lid 18 to the ground power supply terminal (not shown) of the semiconductor die 12. By electrically connecting both the metal base 16 and metal lid 18 to the same ground reference plane, the semiconductor device 10 takes on a stripline configuration, thus reducing the inductance, hence impedance, of the semiconductor device. The air inside the cavity formed by the metal base 16 and lid 18 and the electrically insulating adhesive 28 function as the dielectric. An added advantage to having the metal base 16 and lid 18 is that they provide RF shielding for the semiconductor die 12.

The remaining illustrated embodiments of the present invention contain elements that have similar or identical functions to those elements already discussed in FIG. 1, and as such, will be labeled the same as in FIG. 1.

Figure 2:
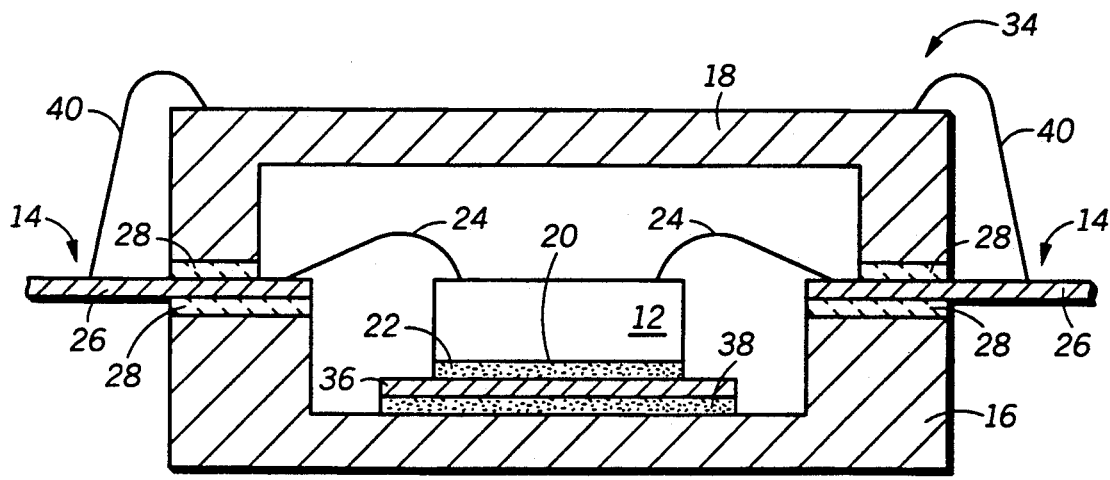
FIG. 2 illustrates, in cross-section, another shielded stripline configuration semiconductor device, a second embodiment of the present invention.

Illustrated in FIG. 2 is a cross-sectional view of a shielded stripline configuration semiconductor device 34, a second embodiment of the present invention. In this second embodiment, leadframe 14 is illustrated to have a mounting area 36 that is electrically conductive. Semiconductor die 12 is mounted on the mounting area 36 with an electrically conductive adhesive 22. Mounting area 36 is then directly bonded to the metal base 16 with another electrically conductive adhesive 38, thus electrically connecting the metal base 16 to the power supply terminal (not shown) of the semiconductor die 12. Adhesive 22 and adhesive 38 can be the same material, but it is not neccessary that they be the same.

In FIG. 2, the metal lid 18 is illustrated to be electrically connected to the ground leads 26, and thus to the ground power supply terminal (not shown) of the semiconductor die 12, by way of external wire bonds 40. External wire bonds 40 can be made with any electrical conductor such as gold, aluminum, or an alloy thereof. Furthermore, external wire bonds 40 are substantially thicker in gauge than internal wire bonds 24. One advantage to using external wire bonds 40 to ground the metal lid 18 is that this step could be performed at the end user's site if desired. However, it should be noted that the metal lid 18 could be grounded in the same way as illustrated in FIG. 1, wherein solder bridges are used to electrically connect the lid 18 to the ground leads 26.

Figure 3:
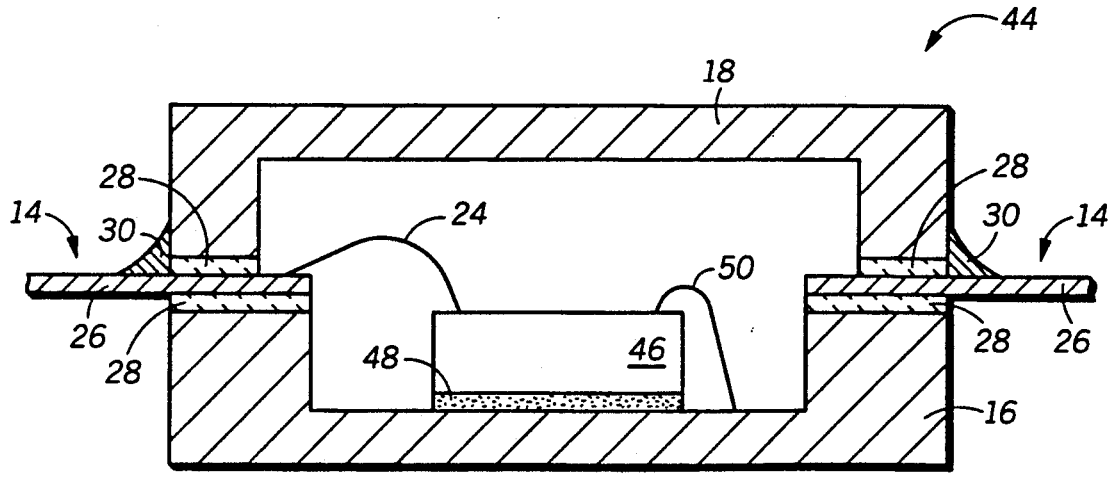
FIG. 3 illustrates, in cross-section, yet another shielded stripline configuration semiconductor device, a third embodiment of the present invention.

FIG. 3 illustrates, in cross-section, yet a third embodiment of the present invention. A shielded stripline configuration semiconductor device 44 is illustrated having a semiconductor die 46, a leadframe 14, a metal base 16, and a metal lid 18. Semiconductor die 46 has a power supply terminal (not shown) as part of its circuitry. In a preferred embodiment, the power supply terminal is a ground terminal. Semiconductor die 12 is directly bonded to the metal base 16 with an adhesive 48. Adhesive 48 can be either an electrically insulating or electrically conductive adhesive, such as any type of die attach epoxy. A wire bond 50 extending from a power supply terminal (not shown) to the metal base 16 serves to electrically connect the metal base 16 to the power supply terminal of the semiconductor die 46. Furthermore, if the power supply terminal is a ground terminal, then the metal base 16 is therefore grounded. It should be noted that the metal lid 18 can be electrically connected to the ground leads 26 of the leadframe 14 by way of external wire bonds in lieu of the solder bridges 30 illustrated in FIG. 3.

Figure 4:
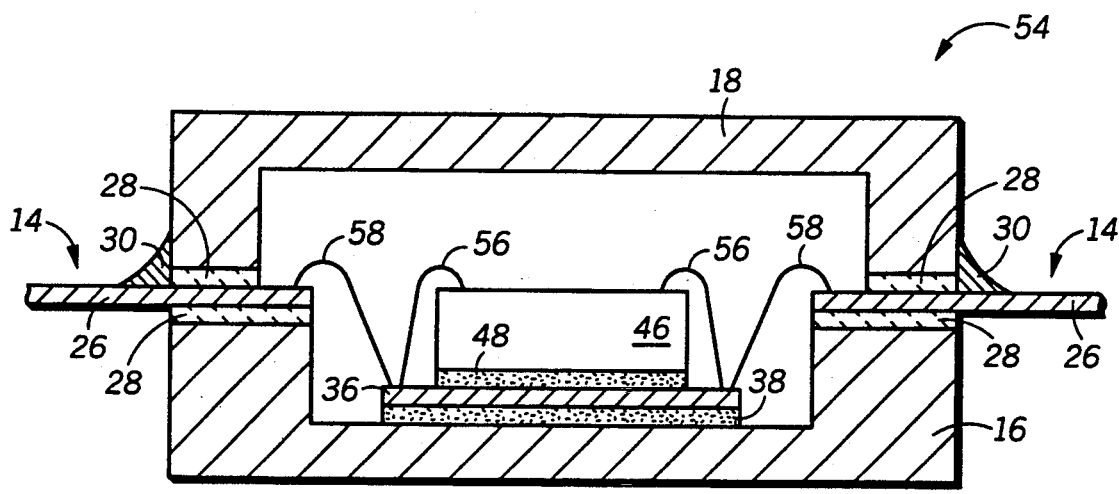
FIG. 4 illustrates, in cross-section, yet another shielded stripline configuration semiconductor device, a fourth embodiment of the present invention.

Illustrated in FIG. 4 is a cross-sectional view of yet another shielded stripline configuration semiconductor device 54, a fourth embodiment of the present invention. In this embodiment, leadframe 14 has an electrically conductive die mounting area 36. Semiconductor die 46 is mounted on the mounting area 36 with an adhesive 48. Adhesive 48 can be either an electrically insulating or electrically conductive adhesive, such as any type of die attach epoxy. Mounting area 36 is then directly bonded to the metal base 16 with an electrically conductive adhesive 38, thus providing an electrical path between the metal base 16 and die mounting area 36. Wire bonds 56 extending from a power supply terminal (not shown) of semiconductor die 46 to the mounting area 36 serve to electrically connect the metal base 16 to the power supply terminal. Furthermore, if the power supply terminal is a ground terminal, then the metal base 16 is therefore grounded. To further reduce inductance in the wires by reducing wire lengths, wire bonds 58 extend from the ground leads 26 to die mounting area 36, although they can extend from the ground leads to the ground terminals on the die 46.

In FIG. 4, an alternative method to electrically connect the metal base 16 to the power supply terminal of the semiconductor die is to have a wire bond extending from the power supply terminal of the semiconductor die directly to the metal base. In that instance, adhesive 38 need not be electrically conductive. It should also be noted that the metal lid 18 can be electrically connected to the ground leads 26 of the leadframe 14 by way of external wire bonds in lieu of the solder bridges 30 illustrated in FIG. 4.

Figure 5:
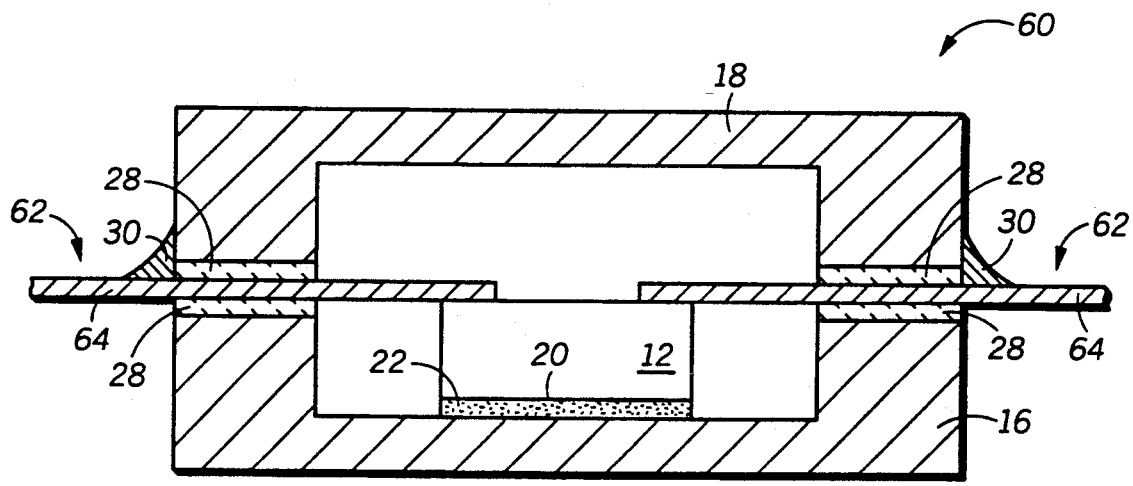
FIG. 5 illustrates, in cross-section, a shielded stripline configuration semiconductor device having a TAB leadframe, a fifth embodiment of the present invention.

FIG. 5 illustrates an alternative shielded stripline configuration semiconductor device 60, a fifth embodiment of the present invention. Device 60 contains a semiconductor die 12, a TAB (tape automated bonding) leadframe 62, a metal base 16, and a metal lid 18. In this embodiment, semiconductor die 12 has a power supply terminal (not shown) as part of its circuitry. In a preferred embodiment, the power supply terminal is a ground terminal. The backside 20 of the semiconductor die 12 is electrically connected to the power supply terminal (not shown). Semiconductor die 12 is directly bonded to the metal base 16 with electrically conductive adhesive 22. Electrically conductive adhesive 22 can be, but not limited to, a silverfilled die attach epoxy or the like. This method of attachment serves to electrically connect the metal base 16 to the power supply terminal (not shown). Furthermore, if the power supply terminal is a ground terminal, then the metal base 16 is therefore grounded.

Additionally illustrated in FIG. 5 is the TAB leadframe 62. TAB leadframes typically consist of patterned metal on polymer tape, such as copper on polyimide. Illustrated in FIG. 5 is the TAB leadframe 62 having a plurality of metal traces 64, including signal, power, and ground traces. Metal traces 64 can also be considered leads because they serve the same function as leads on a leadframe. For the purpose of discussing embodiments of the invention, all metal traces 64 illustrated will be considered ground traces, although it is implicitly understood that other traces not shown in this cross section constitute the remaining signal, power, and ground traces. Semiconductor die 12 is electrically connected to the traces 64 of the TAB leadframe 62 by thermocompression bonding. While not specifically illustrated in FIG. 5, it should be noted that either the semiconductor die 12 or the TAB leadframe 62 must have bumps corresponding to the interconnection sites between the TAB leadframe 62 and die 12, in order for thermocompression bonding to occur.

FIG. 5 further illustrates the metal base 16 and metal lid 18 being sealed with an electrically insulating adhesive 28. The semiconductor die 12 and TAB leadframe 62 are disposed between the metal base 16 and lid 18 such that the base 16 and lid 18 form a protective package body around the die 12 and a portion of the TAB leadframe 62.

Also illustrated in FIG. 5 are solder bridges 30 connecting the metal lid 18 to the ground traces 64. This effectively electrically connects the metal lid 18 to the ground power supply terminal (not shown) of the semiconductor die 12. By electrically connecting both the metal base 16 and metal lid 18 to the same ground reference plane, the semiconductor device 60 takes on a stripline configuration, thus reducing the inductance, hence impedance, of the semiconductor device. The air inside the cavity formed by the metal base 16 and lid 18 and the electrically insulating adhesive 28 function as the dielectric. An added advantage to having the metal base 16 and lid 18 is that they provide RF shielding for the semiconductor die 12.

Figure 6:
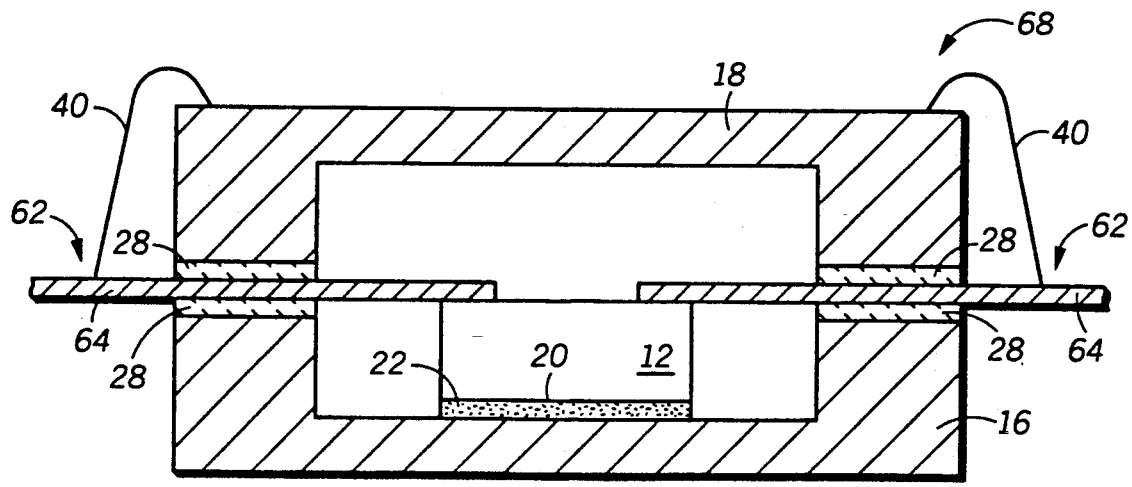
FIG. 6 illustrates, in cross-section, yet another shielded stripline configuration semiconductor device having a TAB leadframe, a sixth embodiment of the present invention.

FIG. 6 illustrates, in cross-section, yet another shielded stripline configuration semiconductor device 68, a sixth embodiment of the present invention. This embodiment contains elements that have similar or identical functions to those elements already discussed in FIG. 5, and as such, will be labeled the same as in FIG. 5. In FIG. 6, the metal lid 18 is illustrated to be electrically connected to the power supply terminal (not shown) of the semiconductor die 12 by way of external wire bonds 40 extending from the metal lid 18 to the ground traces 64. External wire bonds 40 can be made with any electrical conductor such as gold, aluminum, or an alloy thereof. Furthermore, external wire bonds 40 are substantially thicker in gauge than the gauge of wires used for internal wire bonds, which typically range from 1 mil to 1.3 mils. One advantage to using external wire bonds 40 to ground the metal lid 18 is that this step could be performed at the end user's site if desired.

The metal base 16 is electrically connected to the power supply terminal (not shown) of die 12 via the electrically conductive adhesive 22, in the same way as discussed previously for FIG. 5. Furthermore, the base 16 and lid 18 are sealed with electrically insulating adhesive 28, similar to the other previous embodiments.

It should be noted that all of the above embodiments utilize an electrically insulating adhesive 28 to seal the metal base 16 and metal lid 18 together to form a protective package body around a semiconductor die and a portion of the leadframe.

The foregoing description and illustrations contained herein demonstrate many of the advantages associated with the present invention. In particular, it has been revealed that employing a stripline configuration in a semiconductor device can control its inductance, hence its impedance. Moreover, using a metal base and lid to form the package body for the semiconductor device provides the device with built-in RF shielding. Yet another advantages is that embodiments of the present invention allow flexibility in when to ground the metal lid, such as during the assembly process steps or at the end user's site.

Thus it is apparent that there has been provided, in accordance with the invention, a shielded stripline configuration semiconductor device that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the two different ways to ground the metal lid can be used with any of the embodiments interchangeably. In addition, the invention is not limited to any particular semiconductor device package configuration. The portion of the leadframe that extends beyond the package body formed by the metal base and lid can be formed to any desired configuration, such as gull-wing-leaded, J-leaded, or through-hole leaded. It is also important to note that the present invention is not limited in any way to any particular type of semiconductor device. All semiconductor devices that are packaged using some type of leadframe can benefit from using the stripline configuration concept to control impedance of the device. Therefore, it is intended that this invention encompass all such variations and modifications as fall within the scope of the appended claims.

I claim:

1. A shielded stripline configuration semiconductor device comprising:
   a semiconductor die having a power supply terminal on an active surface;

a leadframe having a plurality of leads which are electrically connected to the semiconductor die, wherein the plurality of leads of the leadframe comprise a ground lead which is electrically connected to the power supply terminal of the semiconductor die;

a metal base upon which the semiconductor die is directly mounted with an adhesive;

a metal lid electrically connected to the power supply terminal of the semiconductor die by an external solder bridge from the metal lid to the ground lead;

means for electrically connecting the metal base to the power supply terminal; and electrically insulating adhesive means for sealing the metal base and lid, wherein the semiconductor die and leadframe are disposed between the metal base and lid, such that the metal base and lid form a protective package body around the semiconductor die and a portion of the leadframe.

2. The device of claim 1 wherein the leadframe comprises a TAB leadframe.

3. The device of claim 1 wherein the metal base and lid comprise a material selected from a group consisting of: a nonferromagnetic metal, anodized aluminum, and copper.

4. The device of claim 1 wherein the adhesive means for sealing comprises a material selected from a group consisting of: a B-staged adhesive and a sealing glass.

5. The device of claim 1 wherein the semiconductor die has a backside electrically connected to the power supply terminal.

6. The device of claim 5 wherein the backside of the semiconductor die is directly bonded to the metal base with an electrically conductive adhesive.

7. The device of claim 1 wherein the means for electrically connecting the metal base to the power supply terminal of the semiconductor die comprises a wire bond extending from the power supply terminal to the metal base.

8. A shielded stripline configuration semiconductor device comprising:

a semiconductor die having a ground power supply terminal on an active surface, the ground power supply terminal being electrically connected to a backside of the semiconductor die;

a leadframe having a ground lead, the leadframe being electrically connected to the semiconductor die wherein the ground lead is electrically connected to the ground power supply terminal;

a metal base upon which the semiconductor die is directly mounted with an electrically conductive adhesive to electrically connect the metal base to the ground power supply terminal;

a metal lid electrically connected to the ground lead by a connection external to the metal lid; and an electrically insulating adhesive means for sealing the metal base and lid, wherein the semiconductor die and leadframe are disposed between the metal base and lid, such that the metal base and lid form a protective package body around the semiconductor die and a portion of the leadframe.

9. The device of claim 8 wherein the metal lid is electrically connected to the ground power supply terminal of the semiconductor die by a wire bond extending from the metal lid to the ground lead.

10. The device of claim 8 wherein the metal lid is electrically connected to the ground power supply terminal of the semiconductor die by a solder bridge from the metal lid to the ground lead.

11. The device of claim 8 wherein the leadframe comprises a TAB leadframe.

12. A method for making a shielded stripline configuration semiconductor device comprising the steps of:

providing a semiconductor die having a power supply terminal on an active surface;

providing a leadframe having a plurality of leads;

electrically connecting the semiconductor die to the plurality of leads of the leadframe;

mounting the semiconductor die directly onto a metal base with an adhesive;

electrically connecting the metal base to the power supply terminal of the semiconductor die;

providing a metal lid;

sealing the metal base and lid with an electrically insulating adhesive, wherein the semiconductor die and leadframe are disposed between the metal base and lid, such that the metal base and lid form a protective package body around the semiconductor die and a portion of the leadframe; and electrically connecting the metal lid to the power supply terminal of the semiconductor die with a connection external to the package body.

13. The method of claim 12 wherein the step of providing a semiconductor die comprises supplying a semiconductor die having a ground power supply terminal which is electrically connected to a backside of the semiconductor die.

14. The method of claim 13 wherein the step of electrically connecting the metal base comprises directly bonding the backside of the semiconductor die to the metal base with an electrically conductive adhesive, thus electrically connecting the metal base to the ground power supply terminal.

15. The method of claim 12 wherein the step of electrically connecting the metal base is accomplished by wire bonding the power supply terminal of the semiconductor die to the leadframe.

16. The method of claim 12 wherein the step of electrically connecting the metal lid to the power supply terminal is accomplished by having a solder bridge connecting the metal lid to a ground lead of the leadframe which is electrically connected to the power supply terminal.

17. The method of claim 12 wherein the step of electrically connecting the metal lid to the power supply terminal is accomplished by externally wire bonding the metal lid to a ground lead of the leadframe.

18. The method of claim 12 wherein the step of providing a leadframe comprises providing a TAB leadframe.

19. A shielded stripline configuration semiconductor device comprising:

a semiconductor die having a power supply terminal on an active surface;

a leadframe having a plurality of leads which are electrically connected to the semiconductor die, wherein the plurality of leads of the leadframe comprise a ground lead which is electrically connected to the power supply terminal of the semiconductor die;

a metal base upon which the semiconductor die is directly mounted with an adhesive;

a metal lid electrically connected to the power supply terminal of the semiconductor die by an external wire bond extending from the metal lid to the ground lead;

means for electrically connecting the metal base to the power supply terminal; and electrically insulating adhesive means for sealing the metal base and lid, wherein the semiconductor die and leadframe are disposed between the metal base and lid, such that the metal base and lid form a protective package body around the semiconductor die and a portion of the leadframe.

20. The device of claim 19 wherein the semiconductor die has a backside electrically connected to the power supply terminal.

21. The device of claim 20 wherein the backside of the semiconductor die is directly bonded to the metal base with an electrically conductive adhesive.

22. The device of claim 19 wherein the means for electrically connecting the metal base to the power supply terminal of the semiconductor die comprises a wire bond extending from the power supply terminal to the metal base.

* * * * *